United States Patent [19]

Seyama

[11] Patent Number: 4,912,603
[45] Date of Patent: Mar. 27, 1990

[54] HIGH DENSITY PRINTED WIRING BOARD

[75] Inventor: Kiyotaka Seyama, Kawasaki, Japan

[73] Assignee: Fujitsu Limited, Kawasaki, Japan

[21] Appl. No.: 327,424

[22] Filed: Mar. 23, 1989

Related U.S. Application Data

[63] Continuation of Ser. No. 206,926, May 31, 1988, abandoned, which is a continuation of Ser. No. 939,859, Dec. 9, 1986, abandoned.

[30] Foreign Application Priority Data

Dec. 9, 1985 [JP] Japan .................................. 60-277580

[51] Int. Cl.$^4$ .............................................. H05K 1/00
[52] U.S. Cl. ...................................... 361/409; 29/847; 174/261; 361/410
[58] Field of Search .......................... 29/847; 174/68.5; 361/397, 400, 403, 404, 405, 406, 408, 409, 410, 414

[56] References Cited

U.S. PATENT DOCUMENTS

| | | | |
|---|---|---|---|
| 3,777,221 | 12/1973 | Tatusko ................................ | 361/414 |
| 4,016,463 | 4/1977 | Beall et al. ........................... | 361/383 |
| 4,302,625 | 11/1981 | Hetherington ..................... | 174/68.5 |
| 4,371,744 | 2/1983 | Badet ................................... | 361/410 |
| 4,438,560 | 3/1984 | Kisters ................................. | 29/846 |
| 4,489,364 | 12/1984 | Chance ................................ | 361/409 |
| 4,521,449 | 6/1985 | Arnold et al. ........................ | 427/96 |

OTHER PUBLICATIONS

IBM Technical Disclosure Bulletin, vol. 27, No. 2, Jul. 1984, pp. 1201, 1202, New York, U.S.A.; R. A. Magee et al.: "Pinned Multilayer Ceramic Substrate".

IBM Technical Disclosure Bulletin, vol. 21, No. 11, Apr. 1979, pp. 4491, 4492, New York, U.S.A.; M. R. Marasch et al.: "Dual-Purpose Bonding Pads for Semiconductor Package Substrate".

Elektronik, vol. 29, No. 21, Oct. 1980, pp. 125–128, Munich, Germany, H. Krumm: "Bessere Leiterplattenausnutzung mit neuem Mehrchip-IC-Gehause".

Primary Examiner—Gerald P. Tolin
Attorney, Agent, or Firm—Staas & Halsey

[57] ABSTRACT

A high density printed wiring board, on which terminal pads are provided and high density semiconductor devices each having input and output terminals are mounted through the terminal pads, is provided with via pads which are internally connected with respective previously designated circuits of the board and are placed adjacent each terminal pad and are electrically connected with the corresponding terminal pad by a wiring pattern provided on the surface of the board. When the destination of the terminal pad is to be modified for connection with another circuit of the board, the wiring pattern is severed and electrical connection between the terminal pad and the other circuit is made using insulated new discrete wiring wired on the surface of the board. Modification pads for relaying the new wiring are provided on the surface of the board in areas adjacent to and surrounding the region where the terminal pads are located or arranged within such region so that each modification pad is disposed adjacent a corresponding terminal pad and via pad.

14 Claims, 6 Drawing Sheets

HIGH DENSITY PRINTED WIRING BOARD

This is a continuation of co-pending application Ser. No. 206,926 filed on 5/31/88, now abandoned, which is a continuation of co-pending application Ser. No. 939,859, filed Dec. 9, 1986, now abandoned.

BACKGROUND OF THE INVENTION

The present invention relates to a high density printed wiring board for mounting high density semiconductor devices, and more particularly the present invention relates to a high density printed wiring board having pads and surface wiring patterns which can be easily modified on the surface of the printed wiring board when the circuitry, of the semiconductor devices is modified.

Mechanical parts and electronic parts to be mounted on a printed wiring board have in the past been fixed mechanically using through holes provided in the printed wiring board as shown in FIG. 1. FIG. 1 illustrates an electronic part 101 which is fixed to a printed wiring board 201 using through holes 103. In FIG. 1, the electronic part 101 is fixed to the printed wiring board 201 by soldering its leads 102 to the through holes 103 as shown using solder 105. Although not depicted in FIG. 1, such through holes 103 are connected to internal wires provided in the printed wiring board 201 so that an electronic part 101 is electrically connected to such internal wires by the through holes 103.

However, recently electronic parts having very high packing densities, i.e. Large Scale Integration (LSI) semiconductor devices have been developed. Thus, printed wiring boards mounting such devices must have high density internal wirings. Large size through holes would interfere with the high packing density of a printed wiring board and as a result, almost all through holes have now been replaced with via holes as illustrated in FIG. 2. In FIG. 2, a high density semiconductor device 111 uses bump terminals (hereinafter referred to as BUMPs) as input or output terminals and the BUMPs 112 are respectively fixed to pads 107 mounted on the via holes with solder. Comparing FIGS. 1 and 2, it can be seen that the via hole construction is superior to the through hole construction in realizing high packing densities in printed wiring boards.

Semiconductor devices packed in flat lead packages are also widely used in FIG. 3, the reference numeral 122 designates a flat lead of a flat lead package device 121. However, in the case of high density semiconductor devices, it must be considered that the transmission velocities of input and output signals are lowered as a function of the length of the lead. Therefore, recently semiconductor devices have been packed in packages having BUMPs, and furthermore BUMPs have been applied directly to unpackaged semiconductor elements, semiconductor devices packed in a package are referred to as semiconductor package devices and unpackaged semiconductor devices are referred to as semiconductor element devices. The present invention relates to both the semiconductor package devices and the semiconductor element devices.

Through holes and the via holes are substantially equal, however the holes having a small size and a pad at the surface of the printed wiring board are called via holes in this disclosure.

FIG. 4 is a schematic diagram illustrating a prior art semiconductor element device. FIG. 4(a) is a schematic side view of a semiconductor element device 1 mounted on a printed wiring board 2, while FIG. 4(b) is a schematic plan view thereof. In FIGS. 4(a) and 4(b), the reference numeral 11 represents BUMPs which are soldered onto terminal pads 3 provided on the surface of a printed wiring board 2 and connected with respective inner circuits of the printed wiring board 2 which are not depicted in FIG. 4(a). Thereby, the semiconductor element device 1 is electrically connected to the inner circuits and mechanically fixed to the printed wiring board 2 keeping the distance d between the upper surface of the printed wiring board 2 and the lower surface of the semiconductor device 1. The distance d is generally 0.2 through 0.3 mm. As shown in FIG.4(b), the BUMPs 11 are usually arranged in a grid pattern.

In case where the semiconductor device is a semiconductor package device, the size of the device body is larger than if it were a semiconductor element device, but the arrangement of BUMPs and the mounting of the device on the printed wiring board are the same as shown in FIGS. 4(a) and 4(b).

Thus, BUMPs have been useful for mounting high density semiconductor devices on the prior art high density printed wiring boards. However, problems are presented prior art high density printed wiring boards when the number of BUMPs increases.

Generally, the internal wiring associated with the terminal pad is arranged for connection to designated circuits of the printed wiring board, and it is not easy to change the internal wiring every time the arrangement needs to be modified, because the costs for redesigning and manufacturing modified internal wiring is high.

Therefore, usually, pads called modification pads are provided on the surface of the printed wiring board for modifying the destinations of the terminal pads. The modification pads are connected with the terminal pads by internal wiring provided in the printed wiring board and placed near the via pads. The via pads are generally connected to their respective designated circuits through internal wiring and are usually connected to the modification pads by a surface wiring pattern provided on the surface of the printed wiring board. FIG. 5 illustrates the prior art modification pads, wiring and wiring patterns provided for prior art high density printed wiring boards. FIG.5(a) is a top view illustrating terminal pads 3, prior art modification pads 5 and 55, prior art via pads 4 and 44, and the wiring and wiring patterns associated with such. FIG. 5(b) is a partial cross-sectional view taken at the line p—p' of FIG. 5(a). In FIGS. 5(a) and 5(b), the reference numeral correspond with the reference numerals of FIG. 4 and are used to designate the same parts as in FIG. 4. In FIG. 5(a), the dotted square R1 indicates a terminal pads region in which the terminal pads are gathered. The reference numerals 3 refer to the terminal pads generally and particular terminal pads arranged on the line p—p' are indicated by reference numerals 31 through 36 from right to left respectively for explaining the function of the prior art modification pads.

In FIGS. 5(a) and 5(b), each of the pads 31 through 36 has a respective modification pad and via pad. For example, terminal pads 31 and 32 have modification pads 5 and 55 and via pads 4 and 44 respectively. The via pads 4 and 44 are connected to respective previously designated circuits 991 and 992 through respective internal wiring and are connected respectively to terminal pads 31 and 32 through the modification pads 5 and 55.

That is, terminal pad 31 is connected with modification pad 5 by surface wiring pattern 72 and modification pad 5 is connected with via pad 4 by surface wiring pattern 71, while terminal pad 32 is connected with modification pad 55 by internal wiring 722 and modification pad 55 is connected with via pad 44 by surface wiring pattern 711. "Surface wiring pattern" 72 is used for the wiring between terminal pad 31 and modification pad 5 only because terminal 31 is the most outside terminal pad. On the other hand, the inside terminal pads 32 through 35 are connected to their respective modification pad using internal wiring. However, in FIGS. 5(a) and 5(b), it should be noted that all between the modification pads and the via pads is comprised of respective surface wiring patterns such as the surface wiring pattern 711. Thus, each modification pad usually functions to relay electrical connection between the corresponding terminal pads and via pads. In other words, the modification pads and the surface wiring patterns from the modification pads to the via pads usually function only to extend the wiring from the terminal pads to the via pads. However, if it is required to modify the destination of a particular terminal pad, the modification can be easily made by cutting the surface wiring pattern between the corresponding modification pad and via pad and providing new wiring running along the surface of the printed wiring board. FIG. 6 is a fragmentary top view of the high density printed wiring board 1 of FIG. 5 illustrating an example of cutting the surface wiring patterns 71 and 711. In FIG. 6, the reference numerals are the same as those of FIG. 5 and indicate like parts. When terminal pads 31 and 32 are to be modified so as to be connected with other destinations referred to as circuits 997 and 998 respectively, the modification can be performed by cutting surface wiring patterns 71 and 711 and providing new surface wiring leading respectively to the circuits 997 and 998 along the surface of the printed wiring board 1.

Thus, in the prior art, because the modification pads and the via pads were positioned outside the terminal pads region R1 with the associated wiring and wiring patterns, destination modification was easily performed without redesign and/or need for new printed wiring boards. However, in recent years, the number of input and output terminals of high density semiconductor devices, namely the terminal pads on high density printed wiring boards, has increased to as many as 200 or more, and this has created the following problems in the use of the high density printed wiring boards of the prior art:

(1) the mounting density of high density semiconductor devices on the high density printed wiring board is reduced because the region R2, shown in FIG. 5(a), for prior art modification pads and via pads, needs to be enlarged because of the increase in the number of increase of the terminal pads;

(2) the high density printed wiring board must have two, three or more layers because the amount of internal wiring for connecting the terminal pads to the modification pads is increased, and this results in increased cost; and (3) the signal transmission velocity of the signals running in the high density printed wiring board is decreased because the internal wiring connecting the terminal pads with the modification pads is necessarily longer.

In FIGS. 4 and 5, the BUMPs 11 of the high density semiconductor device 1 are bonded on the terminal pads 3 of the high density printed wiring board 2 so as to keep the distance "d" of about 0.2 mm–0.3 mm between the device 1 and the board 2 as described above. However, in the case of a high density semiconductor device comprising as many as 200 BUMPs, the distance d must be reduced to a small value like 0.1 mm to facilitate the bonding process. In cases where the distance "d" is so small, and when the device is cooled by boiling a coolant, boiling bubbles maybe remain within the structure and lower the cooling efficiency. Moreover, when the number of BUMPs is increased, the cumulative position error by pitch p between the BUMPs also increases. In addition, stress is applied to the bonding parts of the BUMPs and terminal pads, due to the difference of thermal expansion coefficient of the high density semiconductor device and the high density printed wiring board, and as a result, joint reliability between the semiconductor device and the printed wiring board is decreased. To solve such problems, a contact wire has been inserted between each BUMP and in corresponding terminal pad.

FIG. 7 is a schematic side view of a high density semiconductor device mounted on a high density printed wiring board through such contact wires. In FIG. 7, the reference numerals correspond with those of FIG. 4 and indicate the same parts as those of FIG. 4, and the reference numeral 113 indicates the contact wires. Length "l" of the contact wires 113 is determined considering the number of BUMPs and should be adequate for setting the distance d at 0.5 mm or more. Contact wires are effective also in connection with the present invention when the number of BUMPs is large as will be disclosed hereinbelow.

SUMMARY OF THE INVENTION

Therefore, it is an object of the present invention to provide structure to facilitate modifications such as changes in the kind of high density semiconductor device mounted on the high density printed wiring board and in the destinations of the pads of the high density semiconductor device.

It is another object of the present invention to improve the mounting density of high density semiconductor devices on high density printed wiring boards.

It is a further object of the present invention to improve the signal transmission velocity of signals which come in and go out of the high density semiconductor devices mounted on high density printed wiring boards.

It is still further object of the present invention to simplify the internal wiring of high density printed wiring boards for mounting high density semiconductor devices thus reducing the cost of the printed wiring boards.

The foregoing objects can be achieved by positioning the via pads which have previously been located outside the terminal pads region on high density printed wiring boards in the vicinity of the respective terminal pads inside the terminal pads region and positioning the modification pads near the terminal pads region or in the vicinity of respective terminal pads inside the terminal pads region.

DETAILED DESCRIPTION OF THE PREFERRED EMBODIMENTS

The present invention is intended to provide structure to totally or partly shift the modification pads and via pads, which have previously located outside of the terminal pads region R1 of the high density printed wiring board of the prior art, so as to position the modification and via pads inside the region R1.

Figure 8:
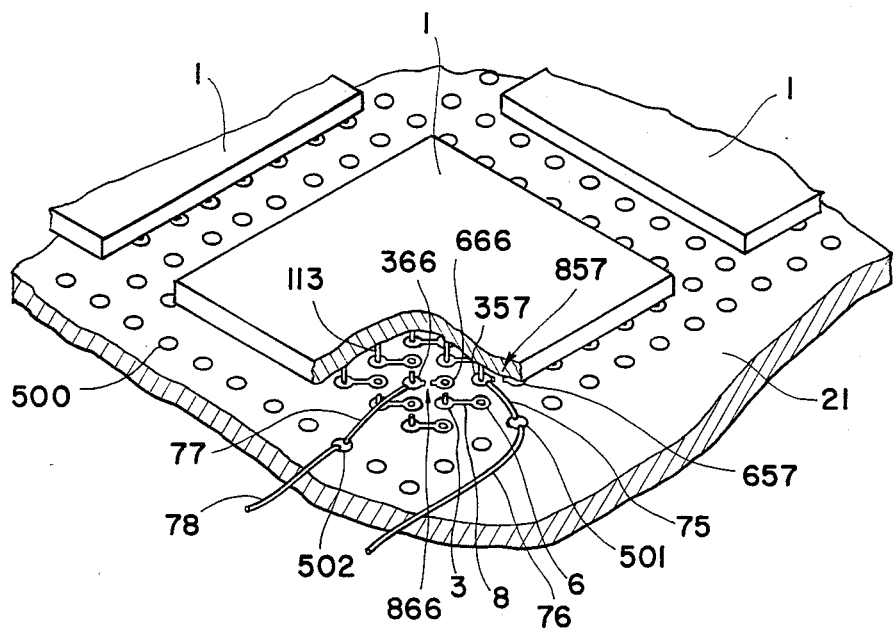
FIG. 8 is a schematic perspective view of a high density printed wiring board, mounting a high density semiconductor device, in accordance with a first embodiment of the present invention.
Figure 9:
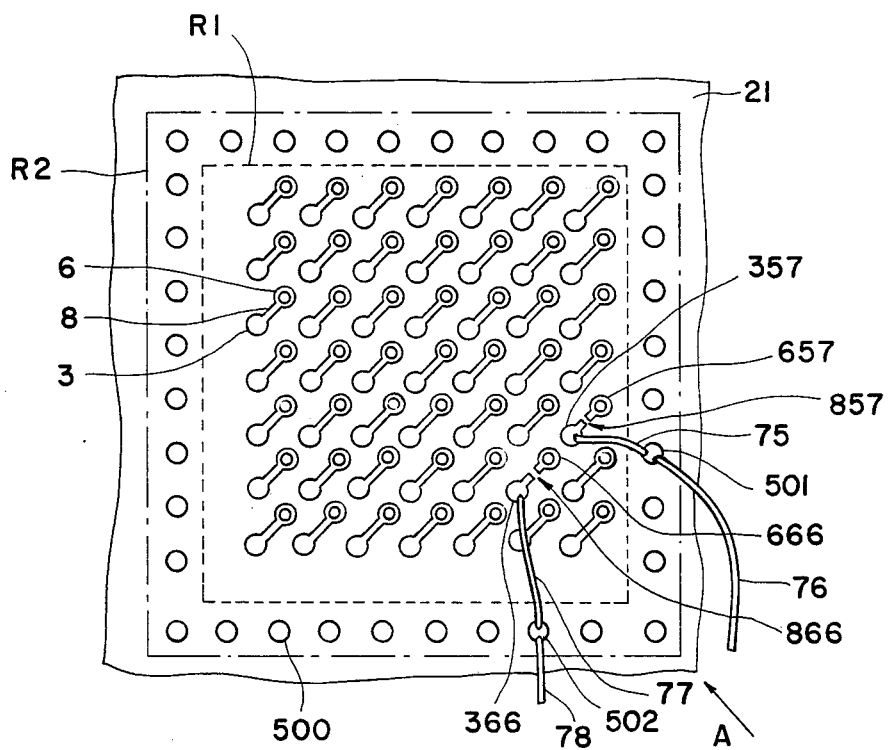
FIG. 9 is a schematic plan view of a high density printed wiring board which further illustrates the FIG. 8 embodiment of the present invention.

A first embodiment of the present invention will be disclosed by referring to FIGS. 8 and 9 where the via pads are positioned inside region R1 and the modification pads are positioned just outside and nearby region R1 and in a single line.

Figure 1:
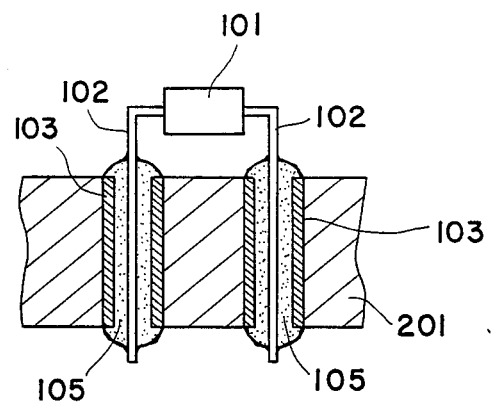
FIG. 1 is a partial sectional view illustrating a prior art procedure for fixing parts with through holes in a printed wiring board.
Figure 2:
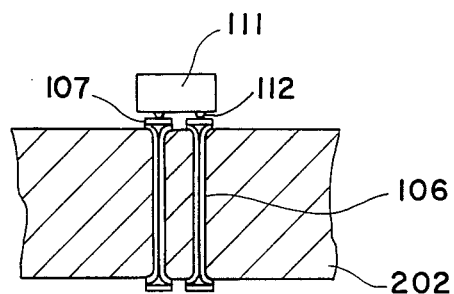
FIG. 2 is a partial sectional view illustrating a prior art procedure for fixing parts with via holes in a printed wiring board.
Figure 3:
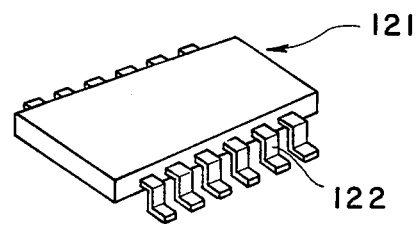
FIG. 3 is a schematic perspective illustration of a semiconductor device of the prior art procedure being packed in a flat lead package.
Figure 4A:
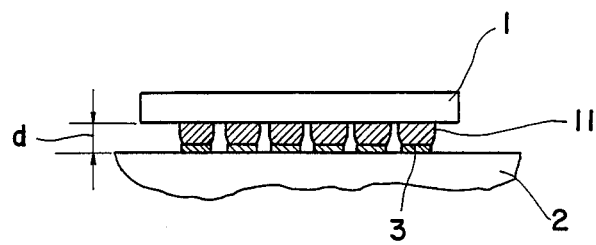
FIG. 4(a) is a schematic side view illustrating a high density semiconductor device comprising BUMPs, mounted on a high density printed wiring board.
Figure 4B:
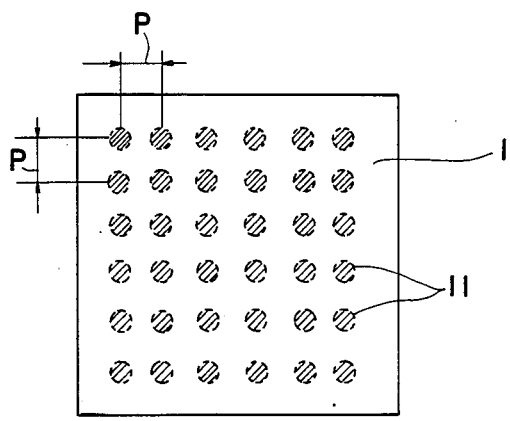
FIG. 4(b) is a schematic plan view of a high density semiconductor device illustrating an arrangement of BUMPs.
Figure 5A:
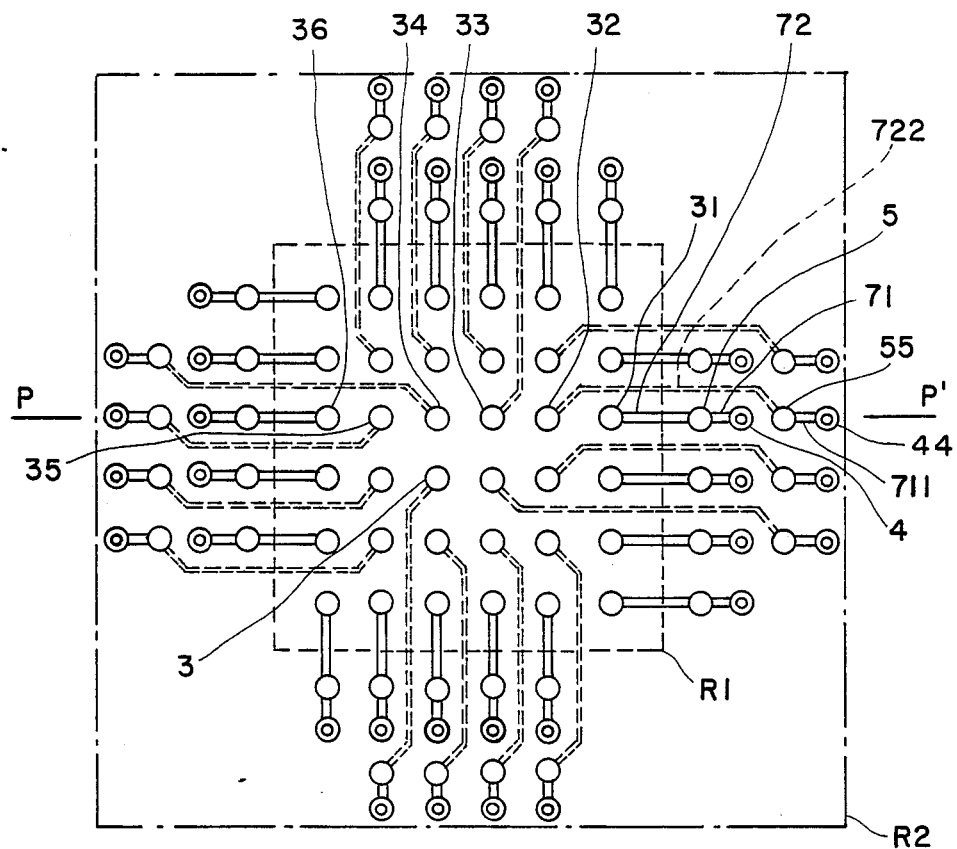
FIG. 5(a) is a schematic partial plan view of a high density printed wiring board of the prior art comprising modification pads and via pads.
Figure 5B:
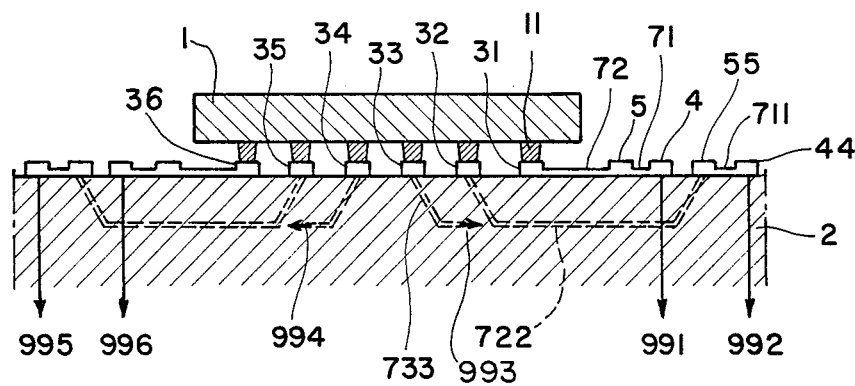
FIG. 5(b) is a schematic partial cross-sectional view of a high density printed wiring board of the prior art comprising modification pads and via pads.
Figure 6:
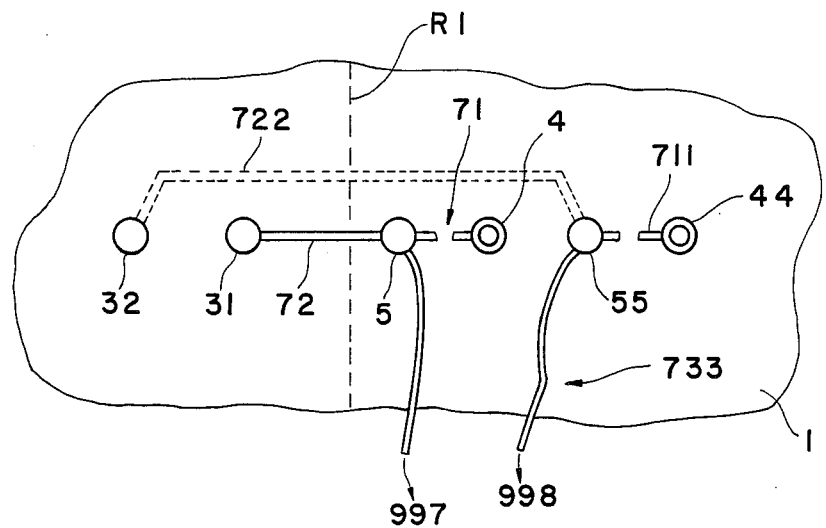
FIG. 6 is a schematic partial plan view of a high density printed wiring board of the prior art illustrating discrete surface wirings connected from two modification pads for the respective destinations of the terminal pads.
Figure 7:
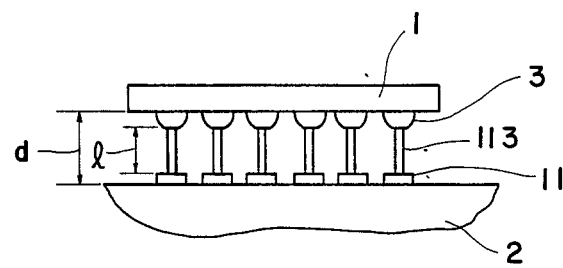
FIG. 7 is a schematic side view of a high density semiconductor device of the prior art mounted on a high density printed wiring board using contact wires.

FIG. 8 is a partial schematic perspective view of a high density printed wiring board mounting high density semiconductor devices and illustrating a first embodiment of the present invention. FIG. 9 is a partial schematic plan view illustrating the high density printed wiring board of the first embodiment of the present invention. In FIGS. 8 and 9, the reference numerals corresponds with those of FIGS. 5(a) and 5(b) and are used to identify the same parts as in FIGS. 5(a) and 5(b). As described above, either a semiconductor element device or a semiconductor package device may be used as the high density semiconductor device in FIG. 8. The high density semiconductor device comprises BUMPs arranged in a grid pattern. FIG. 8 illustrates a high density printed wiring board 21 (hereinafter referred to only as a board 21) mounting the semiconductor device 1 (hereinafter referred to only as the device 1) using contact wires 113. Via pads 6 are arranged one by one in the vicinity of corresponding terminal pads 3 inside the terminal pads region R1. As shown in FIG. 9, the terminal pads are arranged in a grid pattern and each via pad 6 is placed just above the upper side of the corresponding terminal pad 3 and as shown in FIG. 9 is located just at the intermediate position of the longitudinal lines and lateral lines adjacent to the terminal pads 3. Each terminal pad 3 and respective via pad 6 is connected by a corresponding surface wiring pattern 8. The modification pads 500 are arranged in a line just outside and adjacent the terminal pads region R1 and as a result the region R2 is remarkably reduced in size in comparison with the prior art. FIG. 8 is a partial perspective view of the board 21 mounting the devices 1, observed from the direction of arrow A indicated in FIG. 9. In FIGS. 8 and 9, it is assumed that the destinations of terminal pads 357 and 366 are respectively modified. In this case, the surface wiring pattern 857 (866) which connects the terminal pads 357 (366) and the corresponding via pad 657 (666) is cut, new individual surface wiring 75 (77) is connected between the modification pad 501 (502) and the corresponding terminal pad 357 (366), and new individual surface wiring 76 (78) is connected between the new circuit destination and the corresponding modification pad 501 (502), thereby the modification of the destination of the terminal pad is complete. The modification pads 501 and 502 are selected as the pads to be used since they are the pads nearest terminal pads 357 and 366. Since modification is not required for all terminal pads in region R1, the number of modification pads 500 may be less than the total number of the terminal pads 3.

Figure 10:
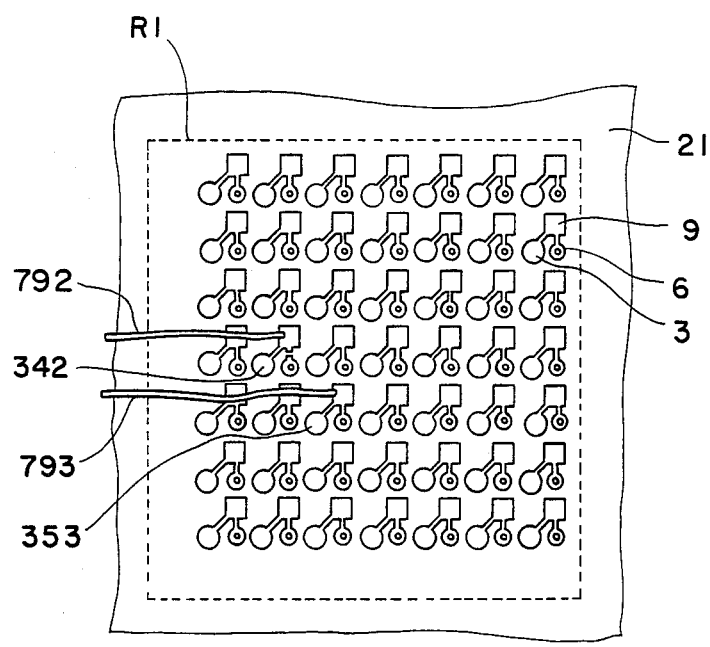
FIG. 10 is a schematic partial plan view of a high density printed wiring board which illustrates a second embodiment of the present invention.
Figure 11:
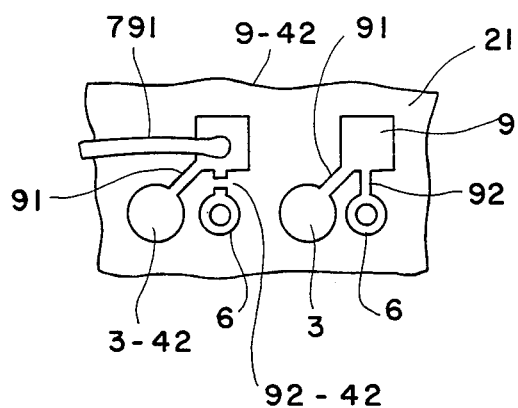
FIG. 11 is a schematic plan view of the high density printed wiring board of FIG. 10 and which illustrates a detail of the second embodiment of the present invention.

As a second embodiment, the present invention encompasses a case where the via pads and also the modification pads are positioned inside the region R1. This second embodiment is illustrated in FIGS. 10 and 11. FIG. 10 is a schematic plan view of the board 21 partially depicting the terminal pads region R1 and illustrating two discrete surface wiring arrangements for modifying the destinations where the terminal pads are to be connected. In FIG. 10, the reference numerals correspond to those of FIG. 9 and designate the same parts as in FIG. 9. In FIG. 10, the via pads 6 are respectively arranged in the vicinity of terminal pads 3 and are located at intermediate positions relate to the terminal pads 3 and adjacent thereto. Meanwhile, the modification pads 9 are also respectively arranged in the vicinity of terminal pads 3 and are located above and to the right of the corresponding terminal pad 3. FIG. 11 illustrates in detail the positional relation among the terminal pads 3, the modification pads 9 and the via pads 6. Namely, FIG. 11 is a partial schematic plan view of the board 21 depicting an enlarged portion of FIG. 10 and the discrete surface wiring for modifying the destinations to be connected. In FIG. 11, reference numerals correspond to those of FIG. 10 to designate the same parts as in FIG. 10. As illustrated in FIG. 11, the terminal pad 3 and modification pad 9, and the modification pad 9 and via pad 6 are connected by respective surface wiring patterns 91 and 92. Therefore, the destination of terminal pad 3-42 is changed by cutting surface wiring pattern 92-42 and connecting a new, discrete surface wire 791 to modification pad 9-42. The cutting and connecting can be easily done at the surface of the board 21.

The pattern of pads in region R1 in the embodiment of FIG. 10 is more complex than in the embodiment of FIG. 9, but the pads are all housed inside of region R1 and as a result, region R2 is eliminated completely and thereby the packing density of the devices 1 on the board 21 is improved to an even greater degree. However, when the number of terminal pads is too great, the embodiment of FIGS. 8 and 9 is superior to the embodiment of FIGS. 10 and 11 because of the complexity of the arrangement of the pads of the embodiment of FIGS. 10 and 11.

In both of the illustrated embodiments, a high density semiconductor device is shown as being mounted on a high density printed wiring board using contact wires, however, it is to be understood that a high density semiconductor device having a small number of input and output terminals way be directly mounted to the terminal pads in accordance with the invention by joining the respective BUMPs and terminal pads directly.

I claim:

1. A high density printed wiring board for mounting at least one high density semiconductor device, each semiconductor device having a plurality of single input terminals and output terminals arranged in a pattern, said printed wiring board comprising:
   at least one group of terminal pads provided on a surface of the printed wiring board and being electrically and mechanically connectable to said signal input and output terminals of the at least one high density semiconductor device, each said group of terminal pads for each high density semiconductor device being formed on a separate terminal pad region of the surface of the printed wiring board, the terminal pad region having a periphery and an area and shape substantially corresponding to the pattern of input and output terminals of each semiconductor device to be mounted thereon; and
   internal wiring disposed within the printed wiring board;
   at least one group of via pads provided within the periphery of the terminal pad region of the printed wiring board, each via pad electrically connecting said corresponding terminal pads with said internal wiring respectively, each via pad being internally connected with said internal wiring which has a predetermined destination corresponding to a designated circuit of the printed wiring board and externally connected with said terminal pad on the surface of the printed wiring board; and
   at least one group of modification pads disposed outside the periphery of the terminal pad region of a corresponding group of terminal pads, each modification pad of each group being selectively connectable to proximate ones of said terminal pads of a corresponding group of terminal pads by a discretionary wire, and each terminal pad which is connected to a modification pad being severable from its corresponding via pad to provide a modified circuit.

2. A high density printed wiring board according to claim 1, wherein the terminal pads of each group are arranged in a plurality of rows and columns, and the via pads of each group are arranged in a plurality of rows and columns disposed substantially between the rows and columns of the terminal pads.

3. A high density printed wiring board according to claim 2, wherein the group of modification pads is disposed in a region outside of the corresponding terminal pad region of the printed wiring board.

4. A high density printed wiring board according to claim 1, wherein the number of modification pads in each modification pad group is less than the number of terminal pads in each corresponding terminal pad group.

5. A high density printed wiring board for mounting at least one high density semiconductor device, each semiconductor device having a plurality of single input terminals and output terminals arranged on a pattern, said printed wiring board comprising:
   at least one group of terminal pads provided on a surface of the printed wiring board and being electrically and mechanically connectable to said signal input and output terminals of the at least one high density semiconductor device, each said group of terminal pads for each high density semiconductor device being formed on a separate terminal pad region of the surface of the printed wiring board the terminal pad region having a periphery and an area and shape substantially corresponding to the pattern of input and output terminals of each semiconductor device to be mounted thereon; and
   internal wiring disposed within the printed wiring board;
   at least one group of via pads provided within the periphery of the terminal pad region of the printed wiring board, each via pad electrically connecting said corresponding terminal pads with said internal wiring respectively, each via pad being internally connected with said internal wiring which has a predetermined destination corresponding to a designated circuit of the printed wiring board and externally connected with said terminal pad within the periphery of the surface of the printed wiring board; and
   at least one group of modification pads disposed within the periphery of the terminal pad region of the printed wiring board which includes the at least one group of terminal pads, each modification pad of the at least one group of modification pads being electrically connected to a corresponding terminal pad by a segment of surface wiring, and being in close proximity to its corresponding terminal pad.

6. A high density printed wiring board according to claim 5, wherein the terminal pads of each group are arranged in a plurality of rows and columns, and the via pads of each group are arranged in a plurality of rows and columns disposed substantially between the rows and columns of the terminal pads.

7. A retouchable high density printed wiring board for mounting a plurality of semiconductor devices, wiring on said printed wiring board forming a circuit capable of being modified using discretionary wirings, said semiconductor devices having a plurality of terminal bumps for connecting said semiconductor device to said circuit, said printed wiring board comprising:
   a terminal pad region defined on the surface of said printed circuit board where said semiconductor device is to be assembled, said terminal pad region having a periphery and an area and shape substantially corresponding to the pattern of input and output terminals of each semiconductor device to be assembled to said terminal pad region;
   a plurality of terminal pads located within the periphery of the terminal pad region for being connected to respective terminals of said semiconductor device;

a plurality of via pads located within the periphery of the terminal pad region, each being positioned close to a respective terminal pad, and being connected to a predetermined circuit point of said circuit;

a plurality of modification pads located within the periphery of the terminal pad region for wiring a descretionary wire when the wiring of said printed circuit board is modified, each of the modification pads being unconnected from other parts of said circuit but connected to said terminal pad and said via pad before said circuit of said circuit board is modified; and a plurality of severable wiring elements formed on surface of said printed wiring board, said elements connected between corresponding terminal pads and via pads, said severable wiring elements being severable to disconnect the via pads form corresponding terminal pads when the circuit of said circuit board is to be modified, the circuitry of said wiring board being reconstructed by means for severing a selected severable wiring element to isolate the corresponding terminal pad from its previously corresponding via pad and its destination circuit point, the isolated terminal pad remaining in connection with a nearby modification pad, said nearby modification pad being connected to a new destination circuit point by a discrete surface wire.

8. A retouchable high density printed wiring board for mounting a plurality of semiconductor devices, wiring on said printed wiring board forming a circuit capable of being modified using discretionary wirings, said semiconductor devices having a plurality of terminal bumps for connecting said semiconductor devices to said circuit, said printed wiring board comprising:

a terminal pad region defined on the surface of said printed circuit board where said semiconductor device is to be assembled, said terminal pad region having a periphery and an area and shape substantially corresponding to the pattern of input and output terminals of each semiconductor device to be assembled to said terminal pad region;

a plurality of terminal pads located within the periphery of the terminal pad region for being connected to respective terminals of said semiconductor device;

a plurality of via pads located within the periphery of the terminal pad region, each being positioned close to a respective terminal pad, and being connected to a predetermined circuit point of said circuit;

a plurality of modification pads located just outside the outer peripheral portion of said terminal pad region, for wiring a discretionary wire when the wiring of said printed circuit board is modified, each of the modification pads being unconnected to other parts of said circuit before circuit of said circuit board is modified; and a plurality of severable wiring elements formed on surface of said printed wiring board, said elements connected between corresponding terminal pads and via pads, said severable wiring elements being severable to disconnect the via pads from corresponding terminal pads when the circuit of said circuit board is to be modified, the circuitry of said wiring board being reconstructed by means for severing a selected severable wiring element to isolate the corresponding terminal pad from its previously corresponding via pad and its destination circuit point, and means for connecting the isolated terminal pad to a nearby modification pad, said nearby modification pad being connected to a new destination circuit point by a discrete surface wire.

9. A retouchable high density printed wiring board according to claim 8, wherein the number of modification pads is less than the number of terminal pads, and located on the periphery of the terminal pad area.

10. A retouchable high density printed wiring board according to claim 9, wherein each modification pad is unconnected to any part of the circuit before it is used for modifying the circuit.

11. A printed wiring board, for mounting a semiconductor device having input terminals and output terminals, said board including internal wirings and comprising:

a plurality of terminal pads provided on a surface of the printed wiring board for electrical connection to the input and output terminals of the semiconductor device, and forming a terminal pads region on the surface of the printed wiring board the terminal pad region having a periphery and an area and shape substantially corresponding to the pattern of input and output terminals of each semiconductor device to be mounted thereon; and a plurality of via pads provided within the periphery of the terminal pads region such that each via pad is positioned near a respective said terminal pad for electrically connecting said terminal pads to said internal wirings of the board, each via pad being internally connected to a said internal wiring providing a connection to a previously designated circuit of the board, and being connected with its respective terminal pad; and a plurality of modification pads provided within the periphery of the terminal pads region, each one being located near a respective terminal pad and via pad for electrically relaying a connection from said terminal pad to a different circuit, not said previously designated circuit, of the printed wiring board.

12. A printed wiring board according to claim 11, further comprising a plurality of first surface wiring patterns provided on the surface of the board for electrically connecting each said modification pad to its respective terminal pad.

13. A printed wiring board according to claim 12, further comprising a plurality of second surface wiring patterns provided on the surface of the board for electrically connecting each said modification pad to its respective via pad, each second surface wiring pattern having a mechanical structure capable of being severed when the corresponding terminal pad is to be connected with a different circuit, not said previously designated circuit, of the printed wiring board.

14. A printed wiring board according to claim 11, wherein said terminal pads are arranged in a grid pattern having an equal pitch in first and second directions, said via pads are arranged so that each via pad is equally spaced between two adjacent terminal pads along the first direction of the grid, and said modification pads are arranged so that each modification pad is equally spaced from each of four terminal pads which are closest to it.

* * * * *

UNITED STATES PATENT AND TRADEMARK OFFICE
CERTIFICATE OF CORRECTION

PATENT NO. : 4,912,603

DATED : March 27, 1990

INVENTOR(S) : Kiyotaka Sayama

It is certified that error appears in the above-identified patent and that said Letters Patent is hereby corrected as shown below:

```
Col. 1, line 16, "circuitry," should be --circuitry--;
        line 57, "ments, semiconductor" should be
        --ments.  Semiconductor.

Col. 2, line 17, "case" should be --cases--;
        line 26, "prior" should be -- in prior--;
        line 49, "such" should be --such pads--.

Col. 3, line 13, "between" should be --wiring between--;
        lines 55 and 56, "increase of the terminal pads"
        should be --terminal pads--.

Col. 4, line 20, "in" should be --the--.

Col. 5, line 5, "art procedure being" should be --art--;
        line 21, "wirings" should be --wiring--;
        line 22, "for the" should be --for modifying the--;
        line 62, "corresponds" should be --correspond--.

Col. 7, line 17, "way" should be --may--.

Col. 9, line 10, "descretionary" should be
        --discretionary--;
```

UNITED STATES PATENT AND TRADEMARK OFFICE
CERTIFICATE OF CORRECTION

PATENT NO. : 4,912,603

DATED : March 27, 1990

INVENTOR(S) : Kiyotaka Sayama

It is certified that error appears in the above-identified patent and that said Letters Patent is hereby corrected as shown below:

Col. 9, line 37, "devices" should be --device--.

Signed and Sealed this

Sixth Day of August, 1991

Attest:

HARRY F. MANBECK, JR.

*Attesting Officer*      *Commissioner of Patents and Trademarks*